United States Patent
Rodgers et al.

(10) Patent No.: US 6,649,947 B2
(45) Date of Patent: Nov. 18, 2003

(54) SURFACE-MICROMACHINED ROTATABLE MEMBER HAVING A LOW-CONTACT-AREA HUB

(75) Inventors: M. Steven Rodgers, Albuquerque, NM (US); Jeffry J. Sniegowski, Edgewood, NM (US); Thomas W. Krygowski, Tarrytown, NY (US)

(73) Assignee: Sandia Corporation, Albuquerque, NM (US)

( * ) Notice: Subject to any disclaimer, the term of this patent is extended or adjusted under 35 U.S.C. 154(b) by 101 days.

(21) Appl. No.: 10/098,214

(22) Filed: Mar. 18, 2002

(65) Prior Publication Data

US 2002/0096018 A1 Jul. 25, 2002

Related U.S. Application Data

(62) Division of application No. 09/639,656, filed on Aug. 15, 2000.

(51) Int. Cl.[7] .......................... H01L 27/14; H01L 21/00; H01L 29/82; H01L 29/84; B81B 5/00
(52) U.S. Cl. .............................. 257/252; 216/2; 216/39; 216/109; 216/57; 438/723; 438/733; 438/739; 438/712; 81/3.33; 74/414
(58) Field of Search ............................. 257/252; 216/2, 216/39, 109, 57; 74/414; 438/723, 733, 739, 712; 81/3.33

(56) References Cited

U.S. PATENT DOCUMENTS

| | | | | |
|---|---|---|---|---|
| 5,459,602 A | * | 10/1995 | Sampsell | 359/234 |
| 5,510,299 A | * | 4/1996 | Li et al. | 438/57 |
| 5,631,514 A | * | 5/1997 | Garcia et al. | 310/309 |
| 6,290,859 B1 | * | 9/2001 | Fleming et al. | 216/2 |
| 6,514,422 B2 | * | 2/2003 | Huang et al. | 216/11 |

* cited by examiner

*Primary Examiner*—Nathan J. Flynn
*Assistant Examiner*—Victor A. Mandala, Jr.
(74) *Attorney, Agent, or Firm*—John P. Hohimar

(57) ABSTRACT

A surface-micromachined rotatable member formed on a substrate and a method for manufacturing thereof are disclosed. The surface-micromachined rotatable member, which can be a gear or a rotary stage, has a central hub, and an annulus connected to the central hub by an overarching bridge. The hub includes a stationary axle support attached to the substrate and surrounding an axle. The axle is retained within the axle support with an air-gap spacing therebetween of generally 0.3 $\mu$m or less. The rotatable member can be formed by alternately depositing and patterning layers of a semiconductor (e.g. polysilicon or a silicon-germanium alloy) and a sacrificial material and then removing the sacrificial material, at least in part. The present invention has applications for forming micromechanical or microelectromechanical devices requiring lower actuation forces, and providing improved reliability.

10 Claims, 5 Drawing Sheets

Section 1 - 1

SURFACE-MICROMACHINED ROTATABLE MEMBER HAVING A LOW-CONTACT-AREA HUB

This is a division of application Ser. No. 09/639,656 filed Aug. 15, 2000, now allowed.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to the field of surface micromachining, and in particular to a surface-micromachined rotatable member (e.g. a gear or rotary stage) having a low-contact-area hub (i.e. an axle assembly), and to a method for fabrication thereof.

BACKGROUND OF THE INVENTION

Surface micromachining can be used to build up the structure of a micromechanical or microelectromechanical device layer by layer by alternately depositing and patterning a plurality of layers of polycrystalline silicon (hereinafter polysilicon) and a sacrificial material (typically a silicate glass or silicon dioxide). After the surface-micromachined structure has been built up, it can be released for operation by removing the sacrificial material using a selective etchant that dissolves the sacrificial material and leaves the various polysilicon layers intact.

A particular problem of interest for surface micromachining is that of improving the performance and reliability of rotating members. Rotating members are subject to wear and surface adhesion (also termed stiction). Lubricants are generally not available for use on a microscopic scale so that overcoming wear and surface adhesion is a major concern in the development of improved surface-micromachined devices. Surface adhesion effects become dominant at very small dimensions and must be overcome before rubbing bodies can move with respect to each other. This can affect the amount of actuation force that must be provided by a motive source (e.g. an electrostatic actuator or microengine) to drive a particular surface-micromachined device.

The present invention provides a rotatable member having a low-contact-area hub to reduce the effects of surface adhesion and friction to provide more efficient operation and improved wear resistance and reliability.

An advantage of the present invention is that a spacing between a rotatable axle and a surrounding stationary axle support of the hub can be made to be less than or equal to 0.3 microns ($\mu$m) to reduce wobble or play in the rotatable member Another advantage of the present invention is that stiction is reduced by providing a small contact area between the rotatable axle and the stationary axle support thereby reducing the actuation force for movement of the rotatable member.

Yet another advantage of the present invention is that fabrication of the rotatable member is relatively insensitive to mask misalignment for patterning the various, layers.

These and other advantages of the present invention will become evident to those skilled in the art.

SUMMARY OF THE INVENTION

The present invention relates to a surface-micromachined rotatable member (e.g. a gear or rotary stage) formed on a substrate (e.g. silicon), and comprising a hub formed from at least one semiconductor layer, with the hub further comprising a stationary axle support attached to the substrate and surrounding a rotatable axle; an annulus centered about the hub and formed from the semiconductor layer; and a bridge connecting the annulus to the hub, with the bridge being formed from another semiconductor layer. Each semiconductor layer can comprise, for example, polysilicon. The axle can include a notch thereabout for supporting the axle above the substrate by engagement with a circular flange on the axle support. An air-gap spacing separating the notch from the circular flange can be, for example, 0.3 microns or less. The axle generally has a diameter in the range of 2–20 $\mu$m; and the annulus, which in the case of a gear can include a plurality of gear teeth spaced about an outer circumference thereof, can have an outer diameter in the range of 20 to 1000 $\mu$m. A plurality of dimples can be fabricated in the annulus to protrude below a lower surface thereof.

The present invention further relates to a method for forming a surface-micromachined rotatable member that comprises steps for alternately depositing and patterning a plurality of layers of a semiconductor (e.g. polysilicon) and a sacrificial material to build up a structure for the rotatable member which further comprises a hub having a stationary axle support surrounding a rotatable axle, and an annulus surrounding the hub and connected to the axle by an overarching bridge; and removing the sacrificial material, at least in part, by etching and thereby releasing the rotatable member for movement. The process of building up the structure for the rotatable member can include one or more chemical-mechanical polishing steps (e.g. for planarizing at least one of the sacrificial layers prior to patterning thereof).

The annulus can be formed from a pair of the semiconductor layers laminated together; and the bridge can be formed from yet another semiconductor layer of the plurality of semiconductor layers. The stationary axle support is also generally formed from the same laminated pair of semiconductor layers used to form the annulus.

To precisely locate the axle in the stationary axle support, a cavity can be etched into a first sacrificial layer, with the axle then being built up by the deposition of semiconductor material (e.g. polysilicon) into the cavity after first depositing a second sacrificial layer (generally ≦0.3 $\mu$m thick) within the cavity to separate the axle from the stationary axle support. Etching of the cavity can be performed using an isotropic etching step, or using a combination of an anisotropic etching step followed by an isotropic etching step. The anisotropic etching step can comprise, for example, reactive ion etching; and the isotropic etching step comprises etching with an isotropic etchant including hydrofluoric acid (HF). The isotropic etching step undercuts the first sacrificial layer below a flanged portion of the stationary axle support so that the axle will be retained within the axle support after the etch-release step whereby the sacrificial material is removed, at least in part, by etching.

The present invention also relates to a method for forming a surface-micromachined rotatable member, comprising steps for depositing at least four layers of polysilicon on a substrate (e.g. a silicon substrate), and depositing a plurality of sacrificial layers, with one sacrificial layer being located between each adjacent pair of the layers of polysilicon; patterning each layer of polysilicon after deposition thereof and forming therefrom a hub having a stationary axle support surrounding a rotatable axle, and an annulus surrounding the hub and connected to the axle by an overarching bridge; and removing each sacrificial layer, at least in part, by etching and thereby releasing the rotatable member for movement. A second polysilicon layer and a third polysilicon layer of the at least four layers of polysilicon can be laminated together to form the stationary axle support and the annulus. The bridge connecting the annulus to the axle can be formed from a fourth polysilicon layer.

The patterning steps can include a step for forming a cavity within the stationary axle support. This can be done using one or more etching steps to etch a first sacrificial layer of the plurality of sacrificial layers. A second sacrificial layer can be then deposited within the cavity to determine a precise separation between the stationary axle support and the axle which will be formed in the cavity. The second sacrificial layer generally has a layer thickness of 0.3 microns or less to provide a low play between the axle and axle support. One or more of the sacrificial layers can also be planarized, as needed, using a chemical-mechanical polishing step.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
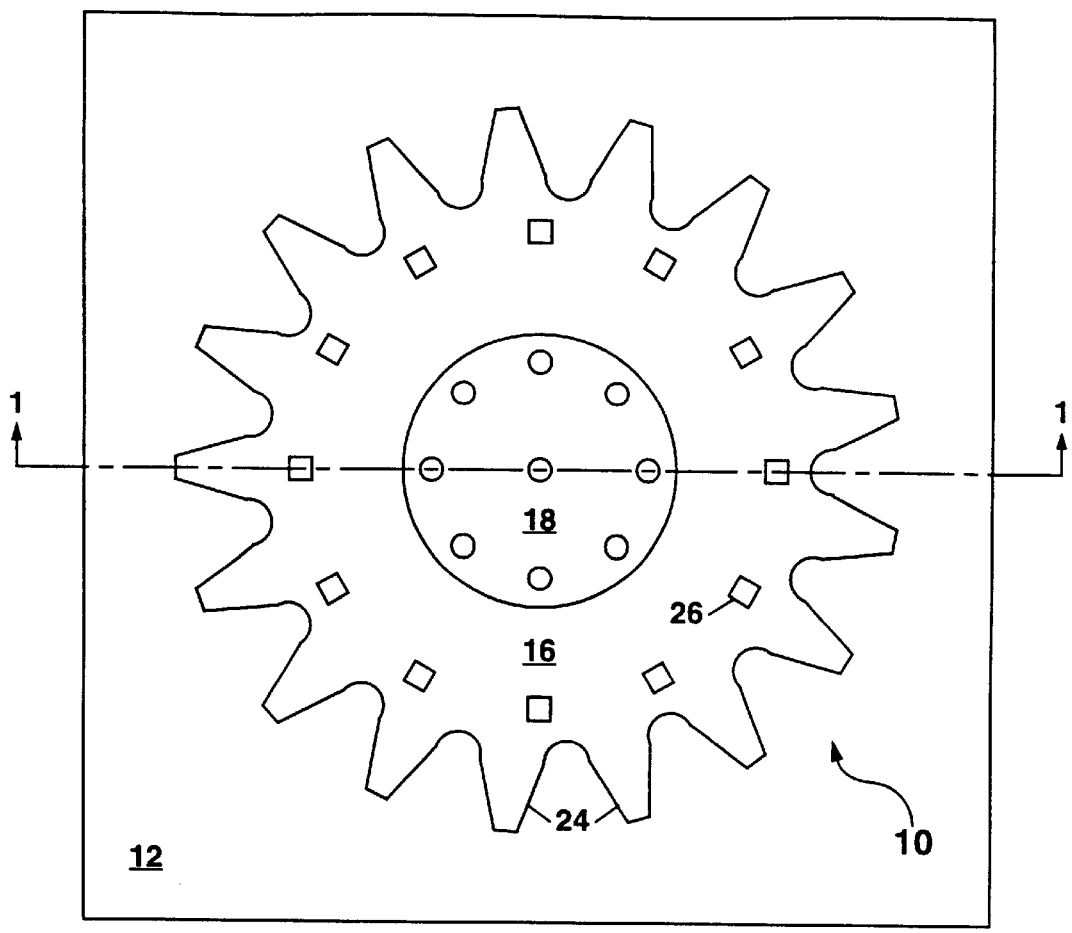
FIGS. 1A and 1B show, respectively, a schematic plan view and a schematic cross-section view of an example of a surface-micromachined rotatable member formed on a substrate according to the present invention.
Figure 1B:
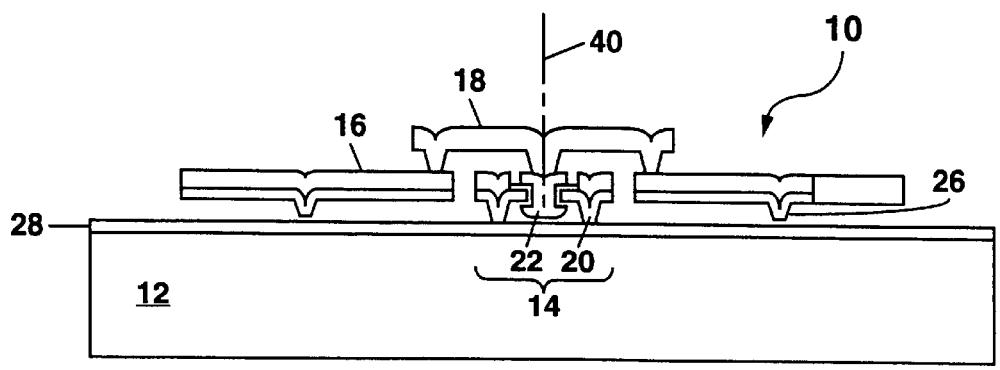

Referring to FIGS. 1A and 1B, there is shown an example of a rotatable member 10 in the form of a gear fabricated on a substrate 12 using surface micromachining as will be described in detail hereinafter. The rotatable member 10 comprises a hub 14, and a peripheral portion in the form of an annulus 16 centered for rotation about the hub 14. The annulus 16 is attached to the hub 14 by an overarching bridge 18. The hub 14 further comprises a stationary axle support 20 which is attached to the substrate 12, and an axle 22 rotatable within and retained by the axle support 20. In the example of FIGS. 1A and 1B, the annulus 16 further comprises a plurality of gear teeth 24 spaced about an outer circumference of the annulus 16 to form a ring gear that can drive or be driven by other meshed gear, (not shown). The annulus 16 in FIGS. 1A and 1B also includes a plurality of dimples 26 protruding below a lower surface thereof to maintain planarity of the gear teeth 24 while limiting contact with the underlying substrate 12.

Fabrication of the surface-micromachined rotatable member 10 will now be described with reference to FIGS. 2A–2L.

Surface micromachining is based on conventional semiconductor integrated circuit (IC) processing steps, including material deposition, photolithography, masking, etching, mask stripping, and cleaning. Many individual process steps are used to form a completed structure of the rotatable member 10 based on the use of repeated IC processing steps as listed above. These conventional IC processing steps are well known to those skilled in the art and, therefore, need not be described herein in great detail.

The present invention utilizes conventional IC processing steps whereby a plurality of layers of a semiconductor such as polysilicon or a silicon-germanium alloy and a sacrificial material (e.g. silicon dioxide or a silicate glass) are alternately deposited and patterned to build up the structure for the rotatable member 10 layer by layer. The term "patterning" as used herein refers to a sequence of well-known IC processing steps including applying a photoresist to the substrate 12, prebaking the photoresist, aligning the substrate 12 with a photomask, exposing the photoresist through the photomask, developing the photoresist, baking the photoresist, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a semiconductor or sacrificial material layer in preparation for defining features into the layer by etching.

Fabrication of the rotatable member 10 will be described hereinafter with reference to polycrystalline silicon (also termed polysilicon) as the semiconductor material used to form the various semiconductor layers wherefrom the rotatable member 10 is formed. Those skilled in the art will understand that other semiconductor materials can be used to form the rotatable member 10 of the present invention. In particular silicon-germanium alloys can be substituted for polysilicon to form the rotatable member 10 with minor modifications to the fabrication process.

The substrate 12 for holding one or more rotatable members 10 formed according to the present invention can comprise silicon (i.e. a monocrystalline silicon or a silicon-on-insulator substrate 12). The silicon substrate 12 can be initially prepared for fabrication of the rotatable member 10 by forming a layer of a thermal oxide over the substrate 12. The thermal oxide can be formed using a conventional wet oxidation process wherein the substrate 12 is heated to about 1050° C. for 1.5 hours to convert a surface portion of the substrate 12 into a layer of silicon dioxide about 630 nanometers thick. A layer of low-stress silicon nitride (e.g. 800 nanometers thick) can then be formed over the substrate 12 using low-pressure chemical vapor deposition (LPCVD) at about 850° C. The thermal oxide and silicon nitride layers (not shown) serve to protect the substrate 12 during subsequent processing and to electrically isolate the substrate 12 from electrical-active elements to be formed in the plurality of polysilicon layers which are also used to form the structure of the rotatable member 10. Such electrical isolation is needed since the polysilicon layers are also generally used to form electrically-active microelectromechanical (MEM) devices; (e.g. motors or actuators) on the substrate 12 for imparting motion to one or more rotatable members 10. In some instances, the thermal oxide and/or the silicon nitride layers can be omitted (e.g. when electrical isolation is not necessary).

Figure 2A:
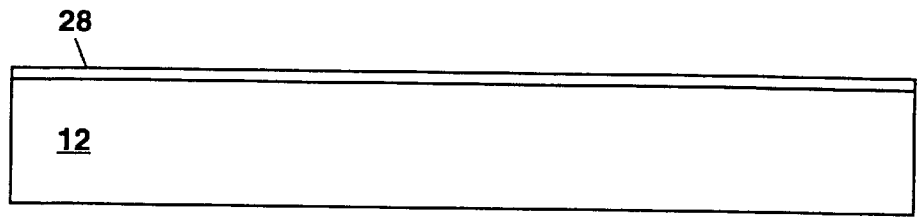
FIGS. 2A–2L schematically illustrate formation of the example of the surface-micromachined rotatable member of FIGS. 1A and 1B.

In FIG. 2A, a first polysilicon layer 28 (termed hereinafter "Poly-0") is blanket deposited over the substrate 12 to a thickness of, for example, 300 nanometers using LPCVD at a temperature of 580° C. All subsequent polysilicon depositions can also be performed at this same temperature using LPCVD, with each subsequent polysilicon layer generally having a layer thickness in the range of 1–3 μm. After deposition of each polysilicon layer, a high-temperature annealing step (e.g. 1100° C. for about 3 hours) can be performed to relieve any stress therein that might otherwise distort the rotatable member 10 and other elements of a MEM device being formed on the substrate 12. Each annealing step is preferably performed when a particular polysilicon layer has been patterned and covered by an overlying layer of the sacrificial material 30.

After deposition, the Poly-0 layer 28 can be patterned as needed to form a ground plane underlying the rotatable member 10 and to form electrical interconnections to any electrically-active MEM devices also being formed on the substrate 12 at the same time as one or more rotatable members 10. A dopant (e.g. phosphorous) can be used to increase the electrical conductivity of the Poly-0 layer 28 and other overlying polysilicon layers as needed. One or more vias (not shown) can also be formed through the underlying thermal oxide and silicon nitride layers at locations wherein the Poly-0 layer 28 is to be electrically connected to the substrate 12 for grounding.

Figure 2B:
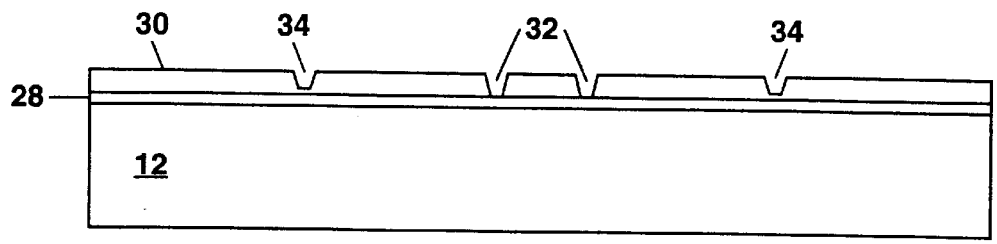

In FIG. 2B, a first layer of a sacrificial material 30 (also termed herein a first sacrificial layer) is blanket deposited over the substrate 12 and patterned using a photolithographically-defined mask and etching (e.g. reactive ion etching) to form a shaped opening 32 (i.e. an annular trench) therethrough at the location wherein the stationary axle support 20 is to be attached to the substrate 12. The shaped opening 32 can have vertical sidewalls, or sidewalls that are tapered slightly due to the nature of the reactive ion etching process. The first layer of the sacrificial material 30 can also be patterned by etching to form a plurality of dimple cuts 34 which extend partway through the layer as shown in FIG. 2B with vertical or tapered sidewalls. Dimples 26 will later be formed by the deposition of one or more polysilicon layers into these dimple cuts 34 (see FIG. 2C). Once patterned, each successive layer of the sacrificial material 30 can serve as a mold to define features in a subsequently-deposited polysilicon layer.

The sacrificial material 30 can comprise silicon dioxide (SiO$_2$) or a silicate glass (e.g. a plasma-enhanced chemical-vapor-deposited oxide, also termed PECVD oxide; or a silicate glass such as TEOS), and can be about 2-μm thick. Chemical-mechanical polishing, as disclosed by Nasby et al in U.S. Pat. No. 5,804,084 which is incorporated herein by reference, can optionally be used to planarize one or more of the layers of the sacrificial material 30 to maintain a planar topography during build up of the structure of the rotatable member 10. Chemical-mechanical polishing can also optionally be used to planarize one or more of the layers of polysilicon.

Figure 2C:
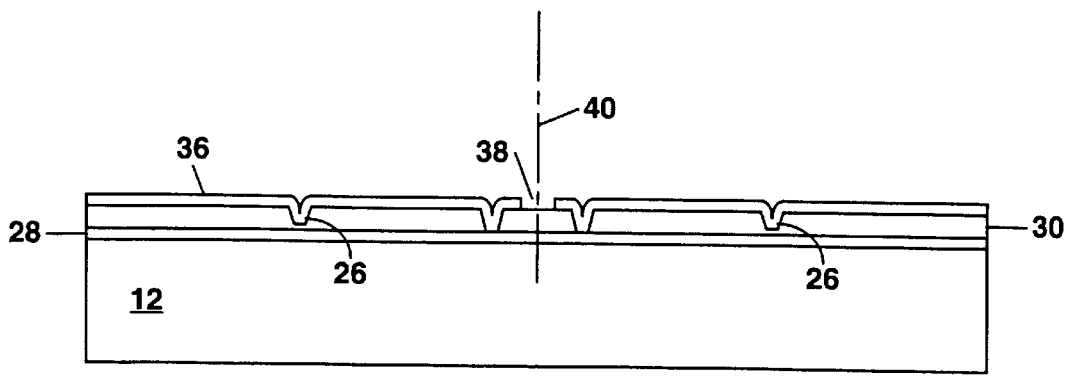

In FIG. 2C, a second polysilicon layer 36 (termed hereinafter "Poly-1") about 1-μm thick can be blanket deposited over the substrate 12 draping into the shaped opening 32 and each dimple cut 34, thereby forming parts of the hub 14 and the annulus 16, and also forming the dimples 26 protruding below a lower surface of the annulus 16. Draping of the Poly-1 layer 36 into the shaped opening 32 forms a flanged shape for the hub 14 as shown in FIG. 2C (see also FIG. 1B).

After deposition and a thermal annealing step, the Poly-1 layer 36 can be patterned by reactive ion etching to define a circular opening 38 extending down through the Poly-1 layer 36 to the underlying sacrificial material 30. This circular opening 38, which is centered about an axis of rotation 40 of the rotatable member 10, will be used to etch a cavity 42 in the sacrificial material 30 wherein the axle 22 will be formed. The exact diameter of the circular opening 38, which will depend upon the diameter of the axle 22 being formed and an air gap to be formed thereabout, can be, for example, in the range of 2–20 μm.

Figure 2D:
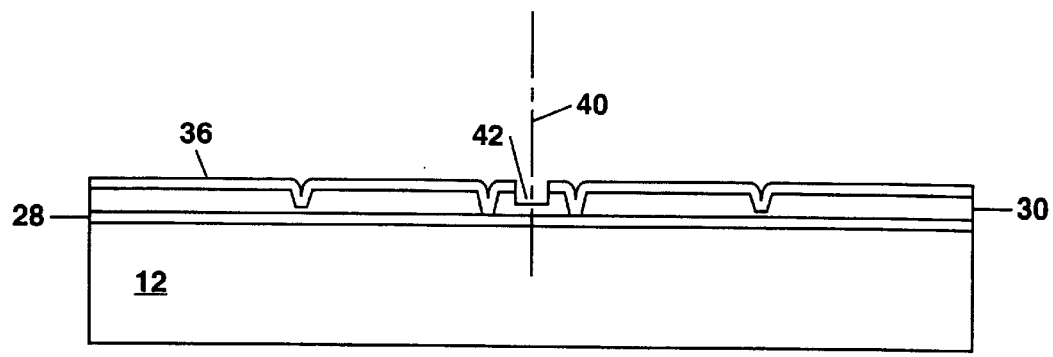
Figure 2E:
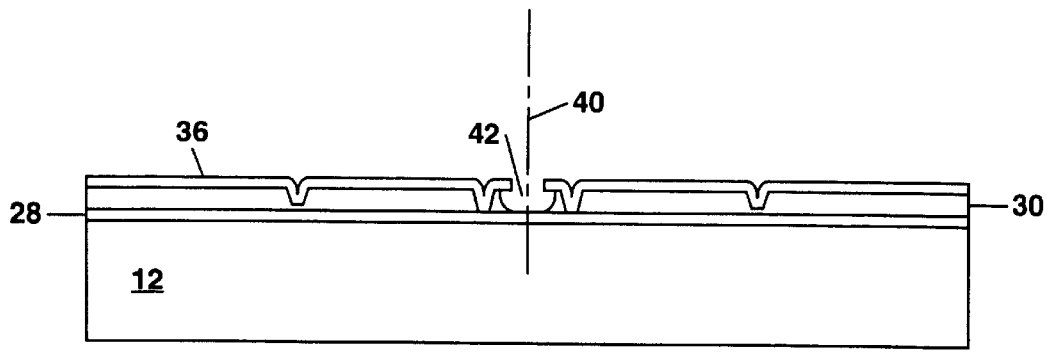

In FIG. 2D, formation of the cavity 42 can be initiated by etching partway through the sacrificial material 30 using an anisotropic etching step (e.g. reactive ion etching). An isotropic etching step can then be used as shown in FIG. 2E to complete etching of the cavity 42. The isotropic etching undercuts the first sacrificial layer below a flanged portion of the axle support 20 being formed from the Poly-1 layer 36 so that the axle 22, which is formed later, will be retained within the axle support 20 after an etch-release step whereby the sacrificial material 30 is removed, at least in part, by etching. The isotropic etching step can be used to remove all or part of the sacrificial material 30 from the cavity 42. Alternately, the cavity 42 can be formed completely with a single isotropic etching step.

The isotropic etching step can be performed using an etchant solution comprising hydrofluoric acid (HF) and timing the etching to remove a predetermined amount of the sacrificial material 30 from the cavity 42. Preferably, some of the sacrificial material 30 is left within the etched cavity 42 to provide an increased separation between the axle 22 and the axle support 20 during formation thereof. This provides an increased manufacturing tolerance to account for possible mask misalignment between the patterning steps used to define the location of the axle support 20 (i.e. the steps shown in FIG. 2B) and the steps used to define the location of the axle 22 (i.e. the steps shown in FIG. 2C). Without this increased manufacturing tolerance, mechanical interference between the axle 22 and the axle support 20 can possibly occur if the mask misalignment exceeds the thickness of a second layer of the sacrificial material 30 which is deposited in FIG. 2F after formation of the cavity 42.

Figure 2F:
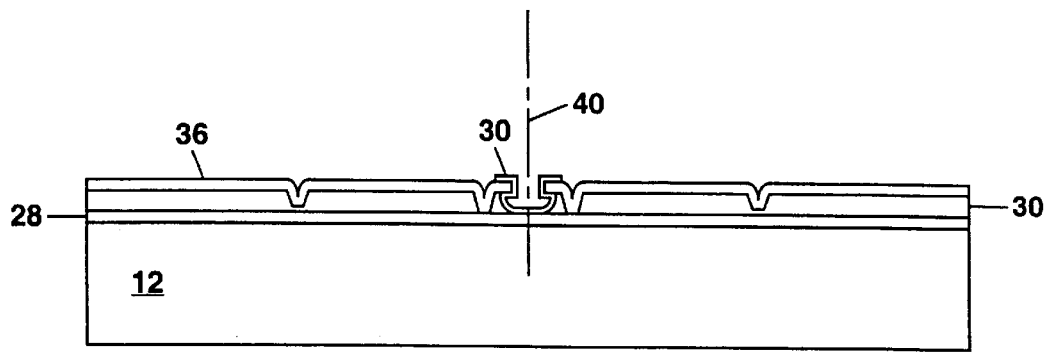

In FIG. 2F, the second layer of the sacrificial material 30 (also termed the second sacrificial layer) is blanket deposited over the substrate 12 and within the cavity 42, and then is patterned to remove all of the second sacrificial layer except for a portion proximate to the cavity 42. The second sacrificial layer generally has a layer thickness of less than or equal to 0.3 μm and serves to define an air gap that separates the axle 22 from the axle support 20 in the completed device 10.

Figure 2G:
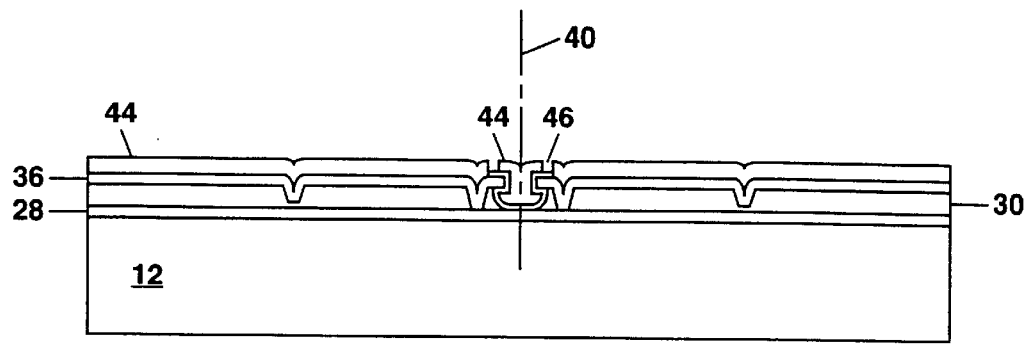

In FIG. 2G, a third layer 44 of polysilicon (termed hereinafter "Poly-2") about 1.5-μm thick is deposited over the substrate 12 by LPCVD. The Poly-2 layer 44 is deposited directly over the Poly-1 layer 36 so that the two layers of polysilicon become laminated together. The Poly-2 layer 44 is also deposited in the cavity 42 to form the axle 22.

After deposition, the Poly-2 layer 44 can be patterned to form an annular etch-release opening 46 that extends down through the Poly-2 layer 44 to expose the second layer of the sacrificial material 30 and to separate the axle 22 from the axle support 20. This annular etch-release opening 46, which generally has a width exceeding the thickness of the second sacrificial layer, allows the sacrificial material 30 to be removed from the cavity 42 during a later etch-release step to release the axle 22 for rotation. A plurality of additional micron-sized circular or square etch-release openings (not shown) can also be formed through each successive polysilicon layer (i.e. Poly-1, Poly-2 and Poly-3) at predetermined spacings for removal of the underlying sacrificial material 30 during the etch-release step.

Figure 2H:
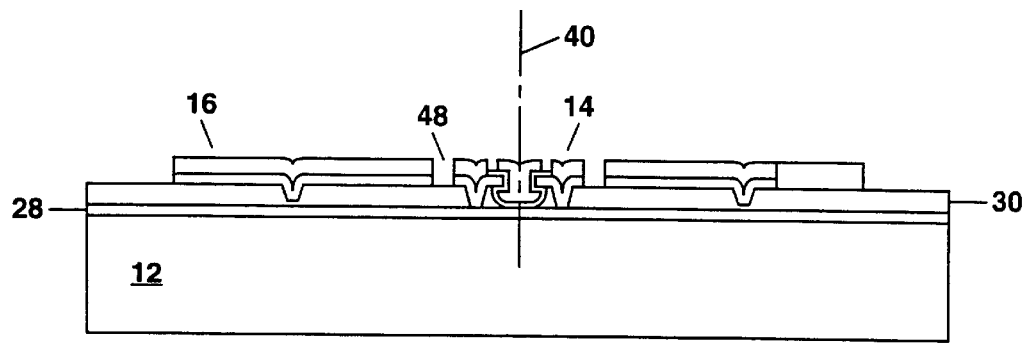

In FIG. 2H, the annulus 16, which can have an outer diameter, for example, in the range of 20–1000 μm, is defined by patterning the Poly-1 and Poly-2 layers, 36 and 44. This can be done by anisotropically etching an annular trench 48 that extends completely through the Poly-1 and Poly-2 layers, 36 and 44, to separate the annulus 16 from the hub 14. In some instances, the Poly-2 layer 44 can be completely removed between the annular etch-release opening 46 and the annular trench 48 so that only a single annular opening is formed.

In FIG. 2H, the etching step used to form the annular trench 48 can also be used to define the outline shape of the rotatable member 10 being formed. In the example of FIG. 1A, the process of defining the outline shape can form the gear teeth 24 in the outer circumference of the annulus 16 so that the annulus 16 becomes a ring gear.

Figure 2I:
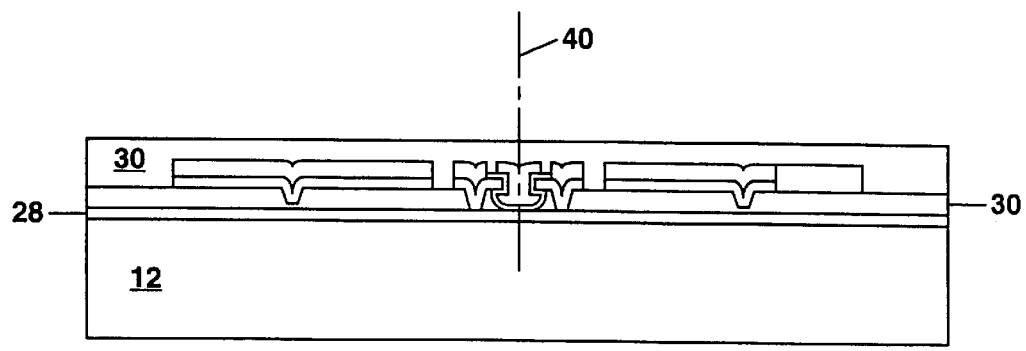
Figure 2J:
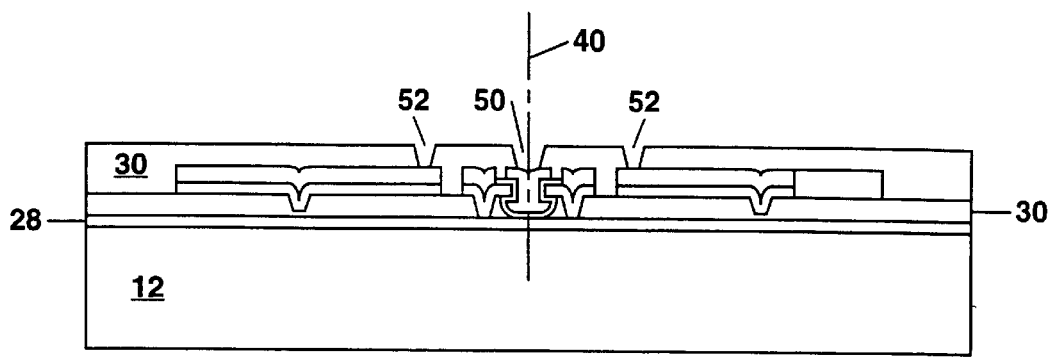

In FIG. 2I, a third layer of the sacrificial material 30 (also termed a third sacrificial layer) is blanket deposited over the substrate 12, filling in the etch-release openings 46 and the space between the annulus 16 and the hub 14 (i.e. the annular trench 48). The third sacrificial layer can be planarized after deposition using a chemical-mechanical polishing step. The third layer of the sacrificial material 30 can then be patterned to form a central via 50 centered about the axis of rotation 40 and extending down to the Poly-2 layer 44 as shown in FIG. 2J. Additionally, patterning of the third sacrificial layer can be used to form at least one outlying via or channel 52 extending downward to the annulus 16 near an inner circumference the annulus 16.

Figure 2K:
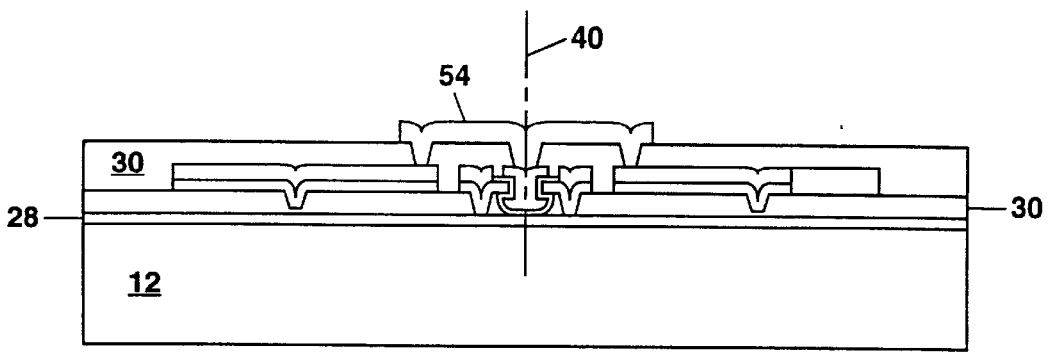

In FIG. 2K, a fourth layer 54 of polysilicon (hereinafter "Poly-3") is blanket deposited over the substrate 12 filling in the central via 50 and the outlying vias or channel 52. The Poly-3 layer 54 can then be patterned to form the bridge 18 connecting the annulus 16 to the hub 14, and to form a plurality of etch-release openings (not shown) through the bridge 18. The bridge 18 can have a circular shape as shown in FIG. 1A, or alternately can comprise a plurality of spokes or arches that connect the annulus 16 to the axle 22. A portion of the Poly-3 layer 54 extending beyond the bridge and away from the axis 40 can also be patterned to form additional gear teeth 24. Thus, for example, a compound gear 10 can be formed with a first set of gear teeth 24 being formed in the Poly-1 and Poly-2 layers, 36 and 44, and with a second set of gear teeth 24 being formed in the Poly-3 layer 54. As another example, a gear 10 can be formed with the gear teeth 24 being formed entirely from the Poly-3 layer 54. And, as yet another example, a gear 10 can be formed with the gear teeth 24 being formed from the combination of the Poly-1, Poly-2, and the Poly-3 layers, with these layers being laminated together or connected together to provide increased strength for the gear teeth 24.

Once the bridge 18 has been formed, a final layer (not shown) of the sacrificial material 30 can be deposited over the substrate 12 in preparation for annealing the Poly-3 layer 54 to relieve any stress therein.

Figure 2L:
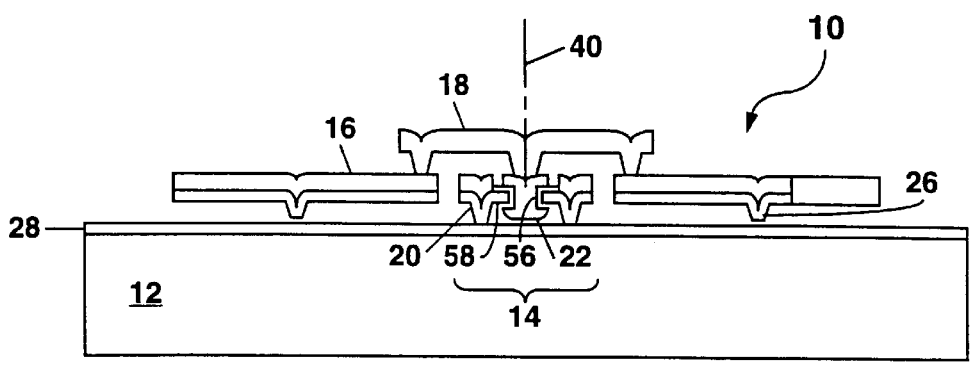

In FIG. 2L, the various layers of the sacrificial material 30 can be removed in an etch-release step using a selective etchant comprising HF that etches away a majority or all of the sacrificial material 30 but which does not chemically attack the polysilicon. This etch-release step, which can take place over a period of several hours, completes the formation of the rotatable member 10 and frees the axle 22 for movement in the axle support 20 while being retained thereby.

Retention of the axle 22 in the axle support 20 is made possible by a notch 56, which is formed about the circumference of the axle 22 during fabrication thereof, with the notch 56 engaging with a circular flange 58 on the axle support 20. The circular flange 58 is shown in FIG. 2L as being formed from the Poly-1 layer 36, although in some cases, the flange 58 can be formed from a combination of the Poly-1 layer 36 and the Poly-2 layer 44. The thickness of the flange 58 is generally in the range of 1–3 μm.

The small air gap (generally $\leq 0.3$ μm) between the notch 56 on the axle 22 and the circular flange 58 on the axle support 20 limits any play in the rotatable member 10 while the small area of contact between the notch 56 and the circular flange 58 reduces forces due to stiction or friction. These improvements are expected to increase the manufacturing yield, performance and reliability of rotatable members 10 formed according to the present invention.

The process steps described herein with reference to FIGS. 2A–2L can also be used to fabricate a rotary stage 10. This can be done, for example, simply by omitting the step for patterning the outer circumference of the annulus 16 as described with reference to FIG. 2H. A substantially planar top surface for the stage 10 can be provided by extending the Poly-3 layer 54 to the same extent as the Poly-1 and Poly-2 layers, 36 and 44.

The matter set forth in the foregoing description and accompanying drawings is offered by way of illustration only and not as a limitation. Other applications and variations of the present invention will become evident to those skilled in the art. For example, multiple meshed gears 10 can be fabricated at the same time on a common substrate using the present invention. As another example, a coating of a wear-resistant material (e.g. silicon nitride, titanium nitride or silicon carbide) can be blanket deposited over the substrate before and/or after deposition of the second layer of the sacrificial material 30. The wear-resistant material can then be patterned along with the second layer of the sacrificial material 30 so that the wear-resistant material undercoats and/or overcoats the remaining portion of the sacrificial material 30 in FIG. 2F. Upon release of the device 10, the wear-resistant material will separate the axle 22 and axle support 20 to provide for an increased wear resistance of the rotatable member 10. Those skilled in the art will also understand that the thicknesses of the individual layers of the semiconductor and the sacrificial material described herein can be varied, or that additional layers of polysilicon and the sacrificial material can be added to the structure of the rotatable member 10 to provide for added functionality or strengthening thereof. Finally, those skilled in the art will understand that the teachings of the present invention can be applied to the formation of any type of surface-micromachined rotatable member known to the art. The actual scope of the invention is intended to be defined in the following claims when viewed in their proper perspective based on the prior art.

What is claimed is:

1. A surface-micromachined rotatable member formed on a substrate, and comprising:

(a) a hub formed from at least one semiconductor layer, with the hub further comprising a stationary axle support attached to the substrate and surrounding a rotatable axle;

(b) an annulus centered about the hub and formed from the semiconductor layer; and (c) a bridge connecting the annulus to the hub, with the bridge being formed from another semiconductor layer.

2. The surface-micromachined rotatable member of claim 1 wherein the substrate comprises silicon.

3. The surface-micromachined rotatable member of claim 1 wherein each semiconductor layer comprises polysilicon.

4. The surface-micromachined rotatable member of claim 1 wherein the axle includes a notch thereabout for supporting the axle above the substrate by engagement with a circular flange on the axle support.

5. The surface-micromachined rotatable member of claim 4 wherein the notch and circular flange are separated by an air gap of 0.3 microns or less.

6. The surface-micromachined rotatable member of claim 1 wherein the axle has a diameter in the range of 2–20 µm.

7. The surface-micromachined rotatable member of claim 1 wherein the rotatable member comprises a gear, and the annulus includes a plurality of gear teeth spaced about an outer circumference thereof.

8. The surface-micromachined rotatable member of claim 1 wherein the rotatable member comprises a rotary stage.

9. The surface-micromachined rotatable member of claim 1 wherein the annulus has an outer diameter in the range of 20 to 1000 µm.

10. The surface-micromachined rotatable member of claim 1 wherein the annulus includes a plurality of dimples protruding below a lower surface thereof.

* * * * *